United States Patent [19]

Proebsting

[11] Patent Number: 5,687,108
[45] Date of Patent: Nov. 11, 1997

[54] POWER BUSSING LAYOUT FOR MEMORY CIRCUITS

[76] Inventor: Robert J. Proebsting, 27800 Edgerton Rd., Los Altos Hills, Calif. 94022

[21] Appl. No.: 630,283

[22] Filed: Apr. 10, 1996

[51] Int. Cl.$^6$ .................................. G11C 5/02; G11C 5/06
[52] U.S. Cl. .............................. 365/51; 365/226; 365/63
[58] Field of Search .......................... 365/51, 63, 72, 365/226

[56] References Cited

U.S. PATENT DOCUMENTS

| | | | |
|---|---|---|---|
| 4,945,513 | 7/1990 | Ueda | 365/51 |
| 5,293,559 | 3/1994 | Kim | 365/63 |
| 5,321,646 | 6/1994 | Tomishima | 365/51 |
| 5,325,336 | 6/1994 | Tomishima | 365/207 |

*Primary Examiner*—David C. Nelms
*Assistant Examiner*—Son Mai
*Attorney, Agent, or Firm*—Townsend and Townsend and Crew LLP

[57] ABSTRACT

A layout technique that improves the bussing of power lines in multi-array memory circuits is disclosed. The present invention utilizes regions inside memory arrays that are otherwise unused by a given metal layer to bus the power to the circuitry between the arrays. The layout technique allows wide power buses to cross over memory arrays extending perpendicular to word lines along wide areas used for word line contacts.

4 Claims, 3 Drawing Sheets

POWER BUSSING LAYOUT FOR MEMORY CIRCUITS

BACKGROUND OF THE INVENTION

This invention relates in general to memory integrated circuits and in particular to a layout architecture that improves power bussing across the memory circuit.

Memory circuits such as dynamic random access memories (DRAMs) are made up of a large number of memory cells located at the cross section of word lines (or rows) and bit lines (or columns). The memory cells are typically arranged in separate arrays with separate row and column decoders that decode the address of a selected memory cell. FIG. 1 shows a simplified example of a prior art random access memory circuit layout architecture. In this typical prior art example, the memory arrays 100 are stacked on either sides of the global column decoder 102. Sense amplifiers 104 are disposed in between the memory arrays 100, and are typically shared by two adjacent memory arrays 100. Power is supplied to the sense amplifiers 104 by power buses 110 that branch off a wide metal bus extending from the power pad 112 down the side of the array. A row decoder 106 is disposed at the end of each memory array 100.

In response to address data selecting a row in the associated memory array 100, row decoder 106 asserts a word line 108. Upon asserting a word line 108, all of the sense amplifiers 104 associated with that array of cells are activated. Activation of all of the sense amplifiers 104 between two arrays draws a significant amount of current from the power supply line 110. It is possible that the same row is repeatedly selected in consecutive cycles. Under this condition, the same group of sense amplifiers 104 are activated for several cycles in a row, increasing the amount of average current flowing through the particular branch of the power supply line 110 that connects to the activated sense amplifiers. To avoid metal migration problems through these metal wires, the power supply lines must be made relatively wide. Thus, the prior art approach requires the use of a wide metal line 110, travelling the length of each array, to supply power to the sense amplifiers 104. The use of such wide metal buses between each pair of arrays adds to the overall circuit area and increases the cost of manufacture.

There is therefore a need for an improved layout technique that efficiently supplies power to various circuit blocks in multi-array memory circuits.

SUMMARY OF THE INVENTION

The present invention offers a novel power bussing layout technique that saves appreciable circuit area. The layout takes advantage of otherwise unused contact regions inside each array of memory cells to route wide power busses to the sense amplifiers.

In one embodiment, the present invention provides a memory circuit having a number of memory arrays stacked along a first direction with a number of sense amplifiers disposed between each pair of memory arrays. Each memory array includes multiple parallel rows of memory cells respectively coupling to multiple parallel word lines made of first layer metal extending in a second direction perpendicular to the first direction. Each row of memory cells is divided into a plurality of segments by a plurality of contact regions used for word line contacts. Power bus lines made of second layer metal extend in the first direction and cross the memory arrays on top of the area defined by the contact regions.

Accordingly, instead of running the power bus along the side of the memory arrays with branches extending in between the arrays to power the sense amplifiers, the present invention allows the wide power buses to cross over the memory arrays extending perpendicular to the word lines, over wide areas used for word line contacts. This arrangement not only saves circuit layout area, but removes the problem of metal migration since regardless of which memory array is selected, the same wide power bus that is located closer to the sense amplifiers supplies the current.

A better understanding of the nature and advantages of the present invention may be had with reference to the following detailed description and drawings.

DESCRIPTION OF THE PREFERRED EMBODIMENT

Figure 2:
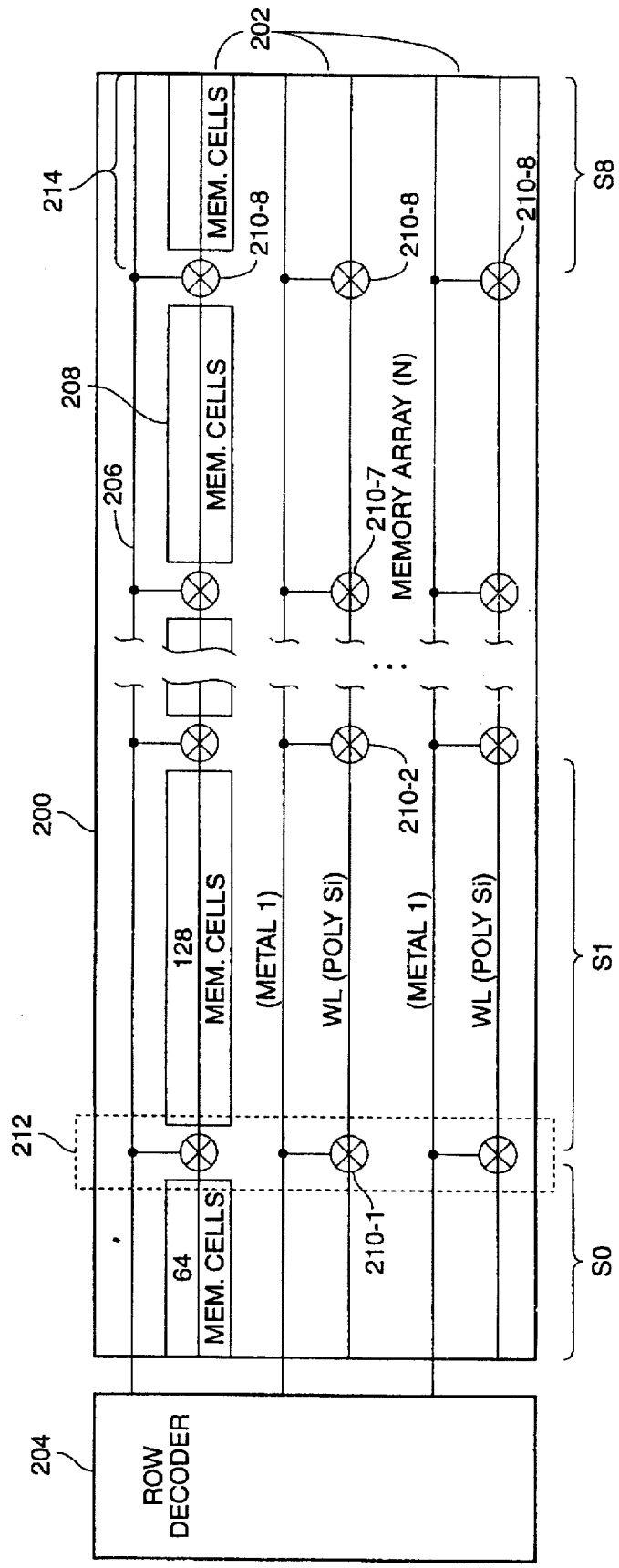
FIG. 2 is a simplified layout schematic for a portion of a memory array.

Referring to FIG. 2 there is shown the internal layout architecture for a single memory array 200. The array 200 is made up of multiple rows 202 of memory cells. Each row 202 of memory cells couples to a word line that is an output of the row decoder 204. Each word line is typically made up of two wires, a metal wire 206 extending in parallel with, and periodically contacting a polysilicon wire 203. The polysilicon wire 203 forms the gate electrode of the transistor in each memory cell, and the metal wire 206 is used as a low resistance path in parallel with the high resistance polysilicon line 208. The periodic contacts 210 to the metal wire 206 help reduce the delay across the long polysilicon wire 208. The contacts 210 cause discontinuity in each row 202 of memory cells. Each row 202 of, for example, 1024 memory cells could be divided into, for example, a first 64 cell segment S0 next to a first contact region 210, followed by seven 128 cell segments separated by six contact regions 210, followed by an eighth contact region 210 and a last 64 cell segment S8 of memory cells.

Figure 1:
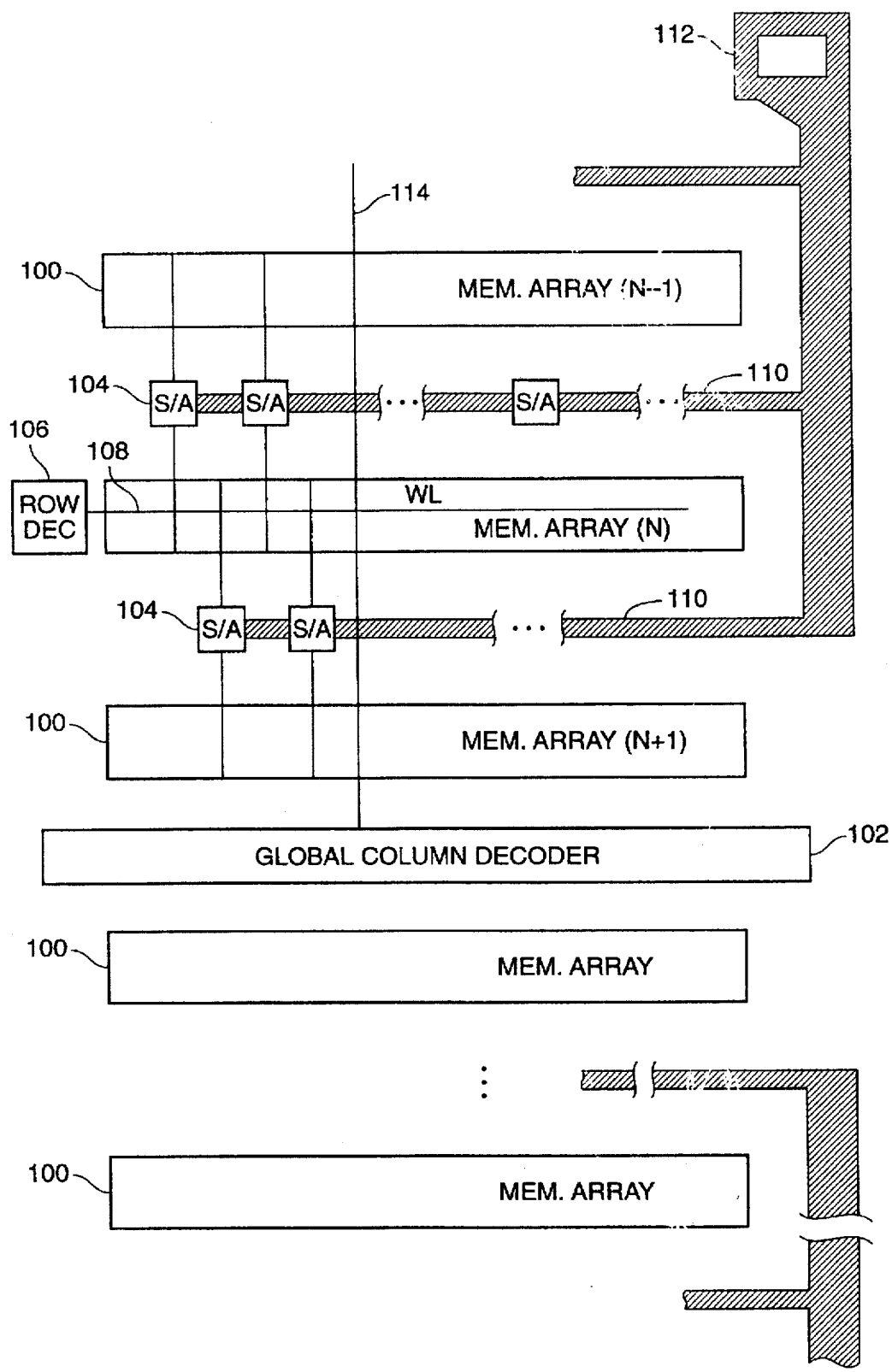
FIG. 1 shows a simplified example of a prior art random access memory circuit layout architecture.
Figure 3:
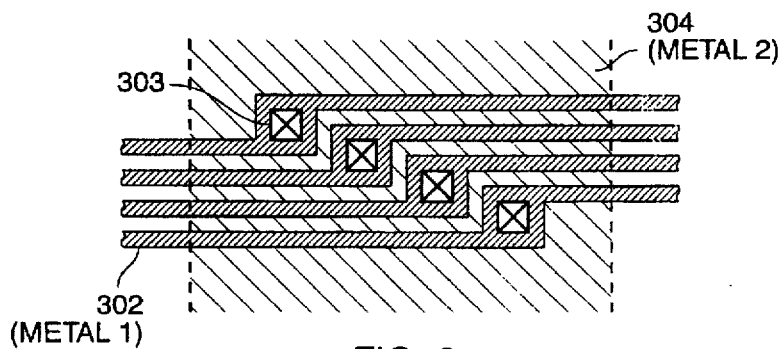
FIG. 3 shows the staggering of adjacent contacts as used inside the memory array of FIG. 2.

A relatively wide silicon area is consumed by the contact region 212 that fits the adjacent contacts 210 for adjacent rows 202. This is because the contacts 210 in the region 212 are typically staggered for a compact design. This is illustrated in the enlarged layout diagram for the contact region 212 in FIG. 3. Since the minimum dimensions of a contact 300 is typically larger than the minimum width of a metal line 302, the contacts are staggered as shown in FIG. 3. This minimizes the vertical dimension of the contact region 212 at the cost of a wider dimension in the horizontal direction. This trade off optimizes the use of silicon area for the type of overall layout architecture as shown in FIG. 1.

Today's memory circuit process technologies offer at least two separate metal layers. In the example of FIG. 2, word line metal wires 206 typically use metal layer 1 (metal-1). Metal layer 2 (metal-2) is typically used for global column decode lines that run perpendicular to the word lines (see global column decoder output line 114 in FIG. 1). The metal-2 column decode lines, however, are limited to the areas above the memory cells, i.e., only over segments S0 to S8. Thus, while the memory array 202 has fairly dense metal-2 wires running over the memory cell segments S0 though S8, the contact regions 212 use metal-1 wires, have no memory cells or sense amplifiers, and therefore require no obstructing metal-2 global column select wires. These relatively wide contact regions 212 are therefore available for wide metal-2 buses that can carry power and/or ground to supply the sense amplifiers with Vcc, and/or ground (Vss). FIG. 3 shows a rather wide metal-2 (Vcc or ground) wire 304 travelling on top of contacts 300 in the contact region 212.

Figure 4:
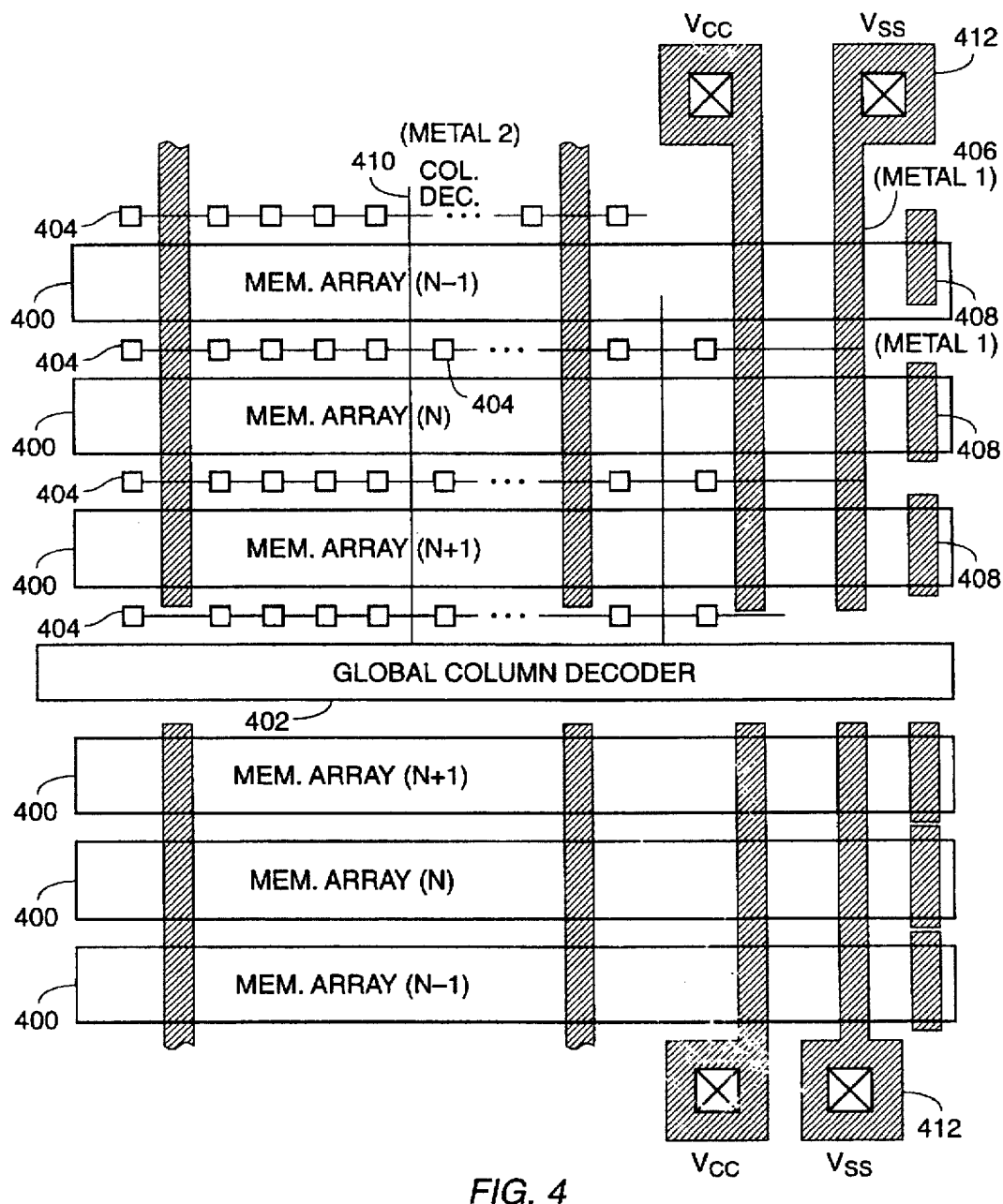
FIG. 4 is a layout schematic of a memory chip showing the power bussing according to the present invention.

Referring to FIG. 4, there is shown a memory circuit architecture that takes advantage of the power bussing layout improvement offered by this invention. Memory arrays 400 are divided into two groups and stacked on either sides of the global column decoder 402. As before, sense amplifiers 404 are disposed in between a pair of memory arrays 400 that share the group of sense amplifiers. The prior art as shown in FIG. 1 routed the power bus down one side of the arrays with branches extending in between and along the same direction as the memory arrays. The layout technique of the present invention as described in connection with FIGS. 2 and 3, however, allows a metal-2 power bus 406 to directly travel across the arrays 400 through regions that are otherwise unused by metal-2. In fact, a number of metal-2 buses can travel across the memory arrays 400 at the various word line contact region intervals. For example, negative and positive power supply buses can alternate between each interval.

The main advantage of the layout technique of this invention is that silicon area is saved by utilizing otherwise unused area to route wide power buses. An added advantage is that, with this scheme, wide power buses are located closer to the sense amplifiers 404, and regardless of which group of sense amplifiers 404 are being activated at any given time, current is drawn from the same wide power bus or buses.

Another feature of the present invention is shown in FIG. 2. The word line metal-1 wire 206 typically runs in parallel all along the word line polysilicon wire 208. However, since there is no contact at the very end of the metal wire 206, the last segment 214 of the metal-1 wire 206 (after the last contact 210-8) is actually unused. This invention contemplates eliminating the final segment 214 of all of the metal-1 wires 206 in each array to allow a wide metal bus to cross each array vertically. Such metal bus can be at least as wide as the exemplary 64 cell memory final segment in each row of memory cells. This is shown in FIG. 4 as well. Wide metal-1 buses 408 can travel across each memory array 400, and if necessary switch to metal-2 buses to cross the regions between each array 400. This provides an additional wide bus that can be used for power bussing without adding to the overall circuit layout.

The technique of using regions otherwise unused by metal-2 to route wide power buses can be applied to the memory arrays 400 on both sides of the global column decoder 402. Thus, one embodiment of the present invention contemplates power pads 412 above and below the stacked memory arrays on either side of the global decoder 402; then, multiple, preferably alternating wide metal-2 power buses (carrying the positive and negative power supplies) cross over the arrays 400 extending perpendicularly to the word lines, to supply power to the selected horizontal rows of sense amplifiers.

In conclusion, the present invention offers a layout technique for multi-array memory circuits for efficient power bussing that reduces silicon area. While the above is a complete description of the specific embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A memory circuit comprising:
    a plurality of memory arrays stacked along a first direction, each memory array comprising:
        a plurality of parallel rows of memory cells coupled to a plurality of parallel polysilicon word lines, respectively, said plurality of polysilicon word lines extending in a second direction perpendicular to said first direction, and
        a plurality of first layer metal word lines corresponding to, and extending in parallel with said plurality of polysilicon word lines, and respectively making contact to said plurality of polysilicon word lines at a plurality of contact regions, such that said plurality of contact regions divide each row of memory cells into a corresponding plurality of segments;
    a plurality of sense amplifiers disposed between, and coupled to an adjacent one of said plurality of memory arrays; and
    power bus lines made of said second layer metal extending in said first direction cross said plurality of memory arrays over a plurality of areas defined by said contact regions,
    wherein, said plurality of first layer metal word lines terminate at a last one of said plurality of contact regions, leaving a last segment of each of said plurality of polysilicon word lines without a corresponding parallel first layer metal line, and
    wherein, a wide first metal layer bus line is disposed over said last segment of each of said plurality of polysilicon word lines in each memory array.

2. The memory circuit of claim 1 wherein each one of said plurality of areas defined by said contact regions comprises a plurality of metal to polysilicon contacts being staggered at minimum dimensions adjacent to each other in said second direction.

3. The memory circuit of claim 2 further comprising a global column decoder disposed between said stack of said plurality of memory arrays dividing said stack into a first half and a second half, said global column decoder having a plurality of output lines from said second layer metal extending across memory arrays in said first direction and respectively coupling to said plurality of word lines.

4. The memory circuit of claim 3 further comprising:
    first ground pad and first power supply pad disposed at a first end of said stack of said plurality of memory arrays, with second layer metal buses extending from said first ground pad and said first power supply pad in said first direction across said first half of said plurality of memory arrays, crossing said memory arrays at said plurality of areas defined by said contact regions; and
    second ground pad and second power supply pad disposed at a second end of said stack of said plurality of memory arrays, with second layer metal buses extending from said second ground pad and said second power supply pad in said first direction across said second half of said plurality of memory arrays, crossing said memory arrays at said plurality of areas defined by said contact regions.

\* \* \* \* \*